(12) United States Patent
Yamanaka

(10) Patent No.: US 11,367,394 B2
(45) Date of Patent: Jun. 21, 2022

(54) DISPLAY DEVICE

(71) Applicant: SHARP KABUSHIKI KAISHA, Sakai (JP)

(72) Inventor: Shigetsugu Yamanaka, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/262,466

(22) PCT Filed: Jul. 30, 2018

(86) PCT No.: PCT/JP2018/028484
§ 371 (c)(1),
(2) Date: Jan. 22, 2021

(87) PCT Pub. No.: WO2020/026307
PCT Pub. Date: Feb. 6, 2020

(65) Prior Publication Data
US 2021/0264854 A1    Aug. 26, 2021

(51) Int. Cl.
*G09G 3/3233* (2016.01)
*G09G 3/3266* (2016.01)
*G09G 3/3275* (2016.01)
*H01L 27/32* (2006.01)

(52) U.S. Cl.
CPC ......... *G09G 3/3233* (2013.01); *G09G 3/3266* (2013.01); *G09G 3/3275* (2013.01); *H01L 27/3218* (2013.01); *H01L 27/3262* (2013.01); *H01L 27/3276* (2013.01); *G09G 2300/0426* (2013.01); *G09G 2300/0452* (2013.01)

(58) Field of Classification Search
CPC . G09G 3/3233; G09G 3/3266; H01L 27/3218
See application file for complete search history.

(56) References Cited

U.S. PATENT DOCUMENTS

| 2003/0052618 | A1 | 3/2003 | Ishizuka |
| 2003/0197666 | A1 | 10/2003 | Akimoto et al. |
| 2004/0017159 | A1* | 1/2004 | Lee ..................... G09G 3/3233 315/169.1 |

(Continued)

FOREIGN PATENT DOCUMENTS

| JP | 2003092183 A | 3/2003 |
| JP | 2003308042 A | 10/2003 |

(Continued)

*Primary Examiner* — Nelson M Rosario
*Assistant Examiner* — Scott D Au
(74) *Attorney, Agent, or Firm* — ScienBiziP, P.C.

(57) ABSTRACT

A display device includes a plurality of sub-pixels. Each sub-pixel includes a light-emitting element, a write transistor connected to a data signal line, and a drive transistor that controls a current that flows through the light-emitting element. The plurality of sub-pixels arranged along a first data signal line include adjacent sub-pixels that emit different colors of light, and each include the write transistor having a conduction terminal electrically connected to the first data signal line. The plurality of sub-pixels arranged along a second data signal line include adjacent sub-pixels that emit different colors of light, and each include the write transistor having a conduction terminal electrically connected to the second data signal line.

20 Claims, 14 Drawing Sheets

(56) References Cited

U.S. PATENT DOCUMENTS

| | | | |
|---|---|---|---|
| 2006/0001623 A1* | 1/2006 | Sung | G09G 3/3233 |
| | | | 345/77 |
| 2006/0066535 A1 | 3/2006 | Shirasaki et al. | |
| 2008/0122763 A1 | 5/2008 | Akimoto et al. | |
| 2015/0138178 A1 | 5/2015 | Woo et al. | |
| 2016/0203752 A1* | 7/2016 | Hayashi | G09G 3/3225 |
| | | | 345/694 |
| 2016/0204094 A1 | 7/2016 | Yang et al. | |
| 2016/0217746 A1* | 7/2016 | An | H01L 27/3262 |
| 2017/0170200 A1 | 6/2017 | Ikeda et al. | |
| 2020/0185420 A1 | 6/2020 | Ikeda et al. | |

FOREIGN PATENT DOCUMENTS

| | | |
|---|---|---|
| JP | 2006098654 A | 4/2006 |
| JP | 2012234210 A | 11/2012 |
| JP | 2017167515 A | 9/2017 |
| WO | 2007/034618 A1 | 3/2007 |
| WO | 2012/157536 A1 | 11/2012 |

* cited by examiner

| DATA SIGNAL LINE | COLOR | Ve | ΔVe |
|---|---|---|---|
| DL1 | r/g | 1.624 | 0.291 |
| DL2 | g/b | 1.915 | |

(b)

| SUB-PIXEL | V0 | V255 | W/L | Vd |
|---|---|---|---|---|
| Pr | 1.000 | 2.225 | 0.15 | 0.378 |
| Pg | 1.000 | 2.732 | 0.15 | 0.535 |
| Pb | 1.000 | 3.236 | 0.15 | 0.690 |

(c)

| SUB-PIXEL | V0 | V255 | W/L | Vd |
|---|---|---|---|---|
| Pr | 1.000 | 2.225 | 0.15 | 0.378 |
| Pg | 1.000 | 2.225 | 0.30 | 0.378 |
| Pb | 1.000 | 2.225 | 0.50 | 0.378 |

(d)

| DATA SIGNAL LINE | COLOR | Ve | ΔVe |
|---|---|---|---|
| DL1 | r/g | 1.624 | 0.000 |
| DL2 | g/b | 1.624 | |

DISPLAY DEVICE

TECHNICAL FIELD

The disclosure relates to a display device.

BACKGROUND ART

Patent Literature 1 discloses a display panel where sub-pixels including organic light-emitting diodes (OLEDs) are arranged in matrix.

CITATION LIST

Patent Literature

Patent Literature 1: Japanese Patent Application Laid-Open No. 2012-234210 (published on Nov. 29, 2012)

SUMMARY

Technical Problem

Connecting pixels of the same color to each data signal line, as described in Patent Literature 1, increases the effective voltage of a particular data signal line, easily degrading transistors connected to the particular data line.

Solution to Problem

A display device according to one aspect of the disclosure includes a plurality of data signal lines, a plurality of scan signal lines, and a plurality of sub-pixels. Each of the plurality of sub-pixels includes a light-emitting element, a write transistor connected to one of the plurality of data signal lines, and a drive transistor that controls a current that flows through the light-emitting element. The plurality of data signal lines include a first data signal line and a second data signal line adjacent to the first data signal line. The plurality of sub-pixels arranged along the first data signal line include adjacent sub-pixels that emit different colors of light, and each include the write transistor having a conduction terminal electrically connected to the first data signal line. The plurality of sub-pixels arranged along the second data signal line include adjacent sub-pixels that emit different colors of light, and each include the write transistor having a conduction terminal electrically connected to the second data signal line.

Advantageous Effect of Disclosure

The aspect of the disclosure can improve problems in display quality resulting from degradation in a transistor connected to a particular data line.

BRIEF DESCRIPTION OF DRAWINGS

FIG. 6(a) is a table showing the effective voltage of each data signal line in another example in the first embodiment. FIG. 6(b) is a table showing sub-pixel properties in another example in the first embodiment. FIG. 6(c) is a table showing sub-pixel properties in further another example in the first embodiment. FIG. 6(d) is a table showing the effective voltage of each data signal line in still another example in the first embodiment.

DESCRIPTION OF EMBODIMENTS

A term "in the same layer" hereinafter refers to that one layer is formed in the same process step (film formation step) as another layer. A term "in a lower position than" hereinafter refers to that one layer is formed in a process step anterior (prior) to a process step of forming a comparative layer. A term "in a higher position than" hereinafter refers to that one layer is formed in a process step posterior to a process step of forming a comparative layer.

Figure 1:
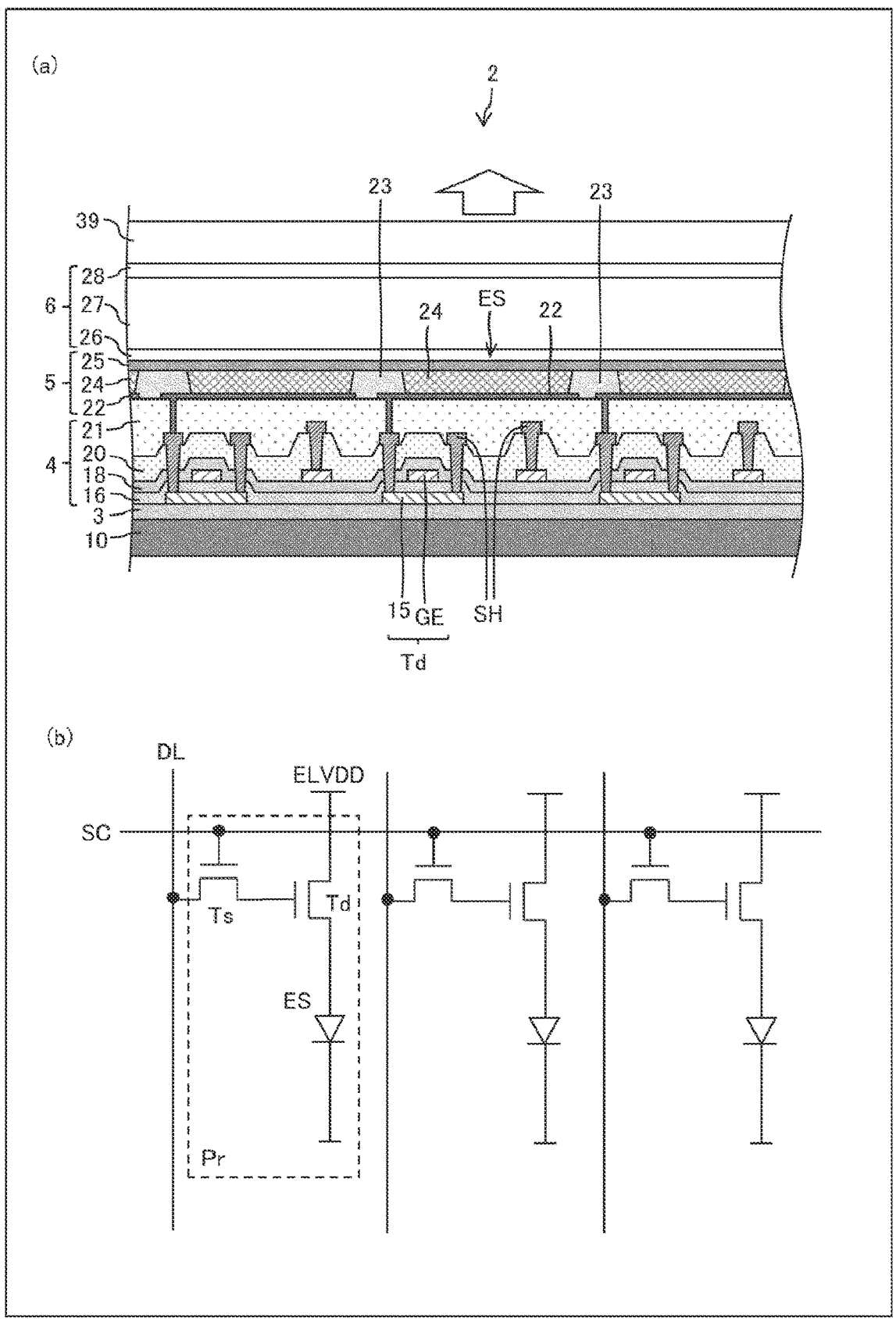
FIG. 1(a) is a cross-sectional view of a configuration of a display device illustrated in FIG. 1.
FIG. 1(b) is a circuit diagram of a sub-pixel.

FIG. 1(a) is a cross-sectional view of a configuration of a display device illustrated in FIG. 1. FIG. 1(b) is a circuit diagram of a sub-pixel. A display device 2 includes a barrier layer 3, a TFT layer 4, a light-emitting element layer 5, a sealing layer 6, and a function layer 39 all of which are stacked on a base 10, as illustrated in FIG. 1.

The base 10 is preferably a glass substrate, a flexible substrate including a resin layer, or other types of substrate. The barrier layer 3 prevents foreign substances, such as water and oxygen, from entering the TFT layer 4 and the light-emitting element layer 5. The barrier layer 3 can be composed of a silicon oxide film, a silicon nitride film, or a silicon oxide nitride film, all of which are formed through CVD, or can be composed of a stack of these layers.

The TFT layer 4 includes the following: a semiconductor film 15; an inorganic insulating film 16 (gate insulating film) in a higher position than the semiconductor film 15; a gate electrode GE in a higher position than the inorganic insulating film 16; inorganic insulating films 18 and 20 in a higher than the gate electrode GE; a source wire SH in a higher position than the inorganic insulating film 20; and a flattening film 21 in a higher position than the source wire SH. Scan signal lines are disposed in the same layer as the gate electrode GE, and data signal lines are disposed in the same layer as the source wire SH.

The semiconductor film 15 is made of, but not limited to, low-temperature polysilicon (LTPS) or oxide semiconductor (e.g., In—Ga—Zn—O semiconductor). Together with the gate electrode GE, the semiconductor film 15 constitutes a transistor (TFT). Although having a top-gate structure in FIG. 2, the transistor may have a bottom-gate structure.

The gate electrode GE and the source wire SH are composed of a monolayer film of metal including at least one of, for instance, aluminum, tungsten, molybdenum, tantalum, chromium, titanium, and copper, alternatively these components are composed of a laminated films of these materials.

The inorganic insulating films 16, 18, and 20 can be composed of a silicon oxide (SiOx) film or a silicon nitride (SiNx) film, both of which are formed through CVD, or can be composed of a laminated layer of these films. The flattening film 21 can be made of organic material that can be applied, such as polyimide or acrylic.

The light-emitting element layer 5 includes the following: an anode (first electrode) 22 in a higher position than the flattening film 21; an edge cover 23 being insulating and covering the edge of the anode 22; an electroluminescence (EL) layer 24 in a higher position than the edge cover 23; and a cathode (second electrode) 25 in a higher position than the EL layer 24. The edge cover 23 is formed by applying an organic material, such as polyimide resin or acrylic resin, followed by patterning through photolithography.

The light-emitting element layer 5 includes a light-emitting element ES (e.g., an organic light-emitting diode or OLED and a quantum-dot light-emitting diode or QLED) including the anode 22, which is in the form of islands, the EL layer 24, and the cathode 25. The light-emitting element ES is controlled by a control circuit disposed in the TFT layer 4. The light-emitting element ES and the control circuit constitute a sub-pixel. The display device 2 includes a plurality of red (R) sub-pixels, a plurality of green (G) sub-pixels, and a plurality of blue (B) sub-pixels.

FIG. 1(b) shows an example where a red sub-pixel Pr includes a write transistor Ts, a drive transistor Td, and a light-emitting element ES that emits red light. The light-emitting element ES has an anode connected to a high-potential power-source line (ELVDD line) via the drive transistor Td. The drive transistor Td has a gate terminal connected to a data signal line DL via the write transistor Ts. The write transistor Ts has one conduction terminal connected to the data signal line DL, and the other conduction terminal connected to the gate terminal of the transistor Td. The write transistor Ts has a gate terminal connected to a scan signal line SCn. The light-emitting element ES has a cathode shared with the sub-pixels.

For instance, the EL layer 24 has a stack of, in sequence from the bottom, a hole injection layer, a hole transport layer, a light-emitting layer, an electron transport layer, and an electron injection layer. The light-emitting layer is formed through an evaporation or ink-jet method and is provided in the form of islands overlapping the openings of the edge cover 23. The other layers are provided in the form of islands or in a flat manner (common layer). In some embodiments, one or more of the hole injection layer, hole transport layer, electron transport layer, and electron injection layer can be omitted.

Forming an OLED light-emitting layer through evaporation uses a fine metal mask (FMM). The FMM is a sheet (made of Invar for instance) having many openings, through one of which an organic substance passes, thus forming an island-shaped light-emitting layer.

For a QLED light-emitting layer, applying, through an ink-jet method, a solvent with quantum dots being distributed for instance can form an island-shaped light-emitting layer (corresponding to one sub-pixel).

The anode (positive electrode) 22 has a stacked film of, for instance, indium tin oxide (ITO) and silver (Ag) or Ag-containing alloy. The anode 22 reflects light. The cathode (negative electrode) 25 can be made of translucent conductive material, such as MgAg alloy (super-thin film), ITO, or indium zinc oxide (IZO).

When the light-emitting element ES is an OLED, a drive current between the anode 22 and the cathode 25 causes holes and electrons to rejoin within a light-emitting layer, thus generating excitons. These excitons emit light in the process of transition to a ground state. Since the cathode 25 transmits light, and the anode 22 reflects light, the light from the EL layer 24 travels upward and goes out from the top.

When the light-emitting element ES is an QLED, a drive current between the anode 22 and the cathode 25 causes holes and electrons to rejoin within a light-emitting layer, thus generating excitons. These excitons emit light (fluorescent light) in the process of transition from a conduction band level of the quantum dots to a valence band level of the quantum dots.

The light-emitting element layer 5 may include light-emitting elements (e.g., inorganic light-emitting diodes) other than such an OLED and QLED as described above.

The sealing layer 6 transmits light. The sealing layer 6 includes an inorganic sealing film 26 covering the cathode 25, an organic buffer film 27 in a higher position than the inorganic sealing film 26, and an inorganic sealing film 28 in a higher position than the organic buffer film 27. The sealing layer 6, which covers the light-emitting element layer 5, prevents foreign substances, such as water and oxygen, from penetrating the light-emitting element layer 5.

The function film 39 serves as, for instance, at least one of an optical compensator, a touch sensor, and a protector.

First Embodiment

Figure 2:
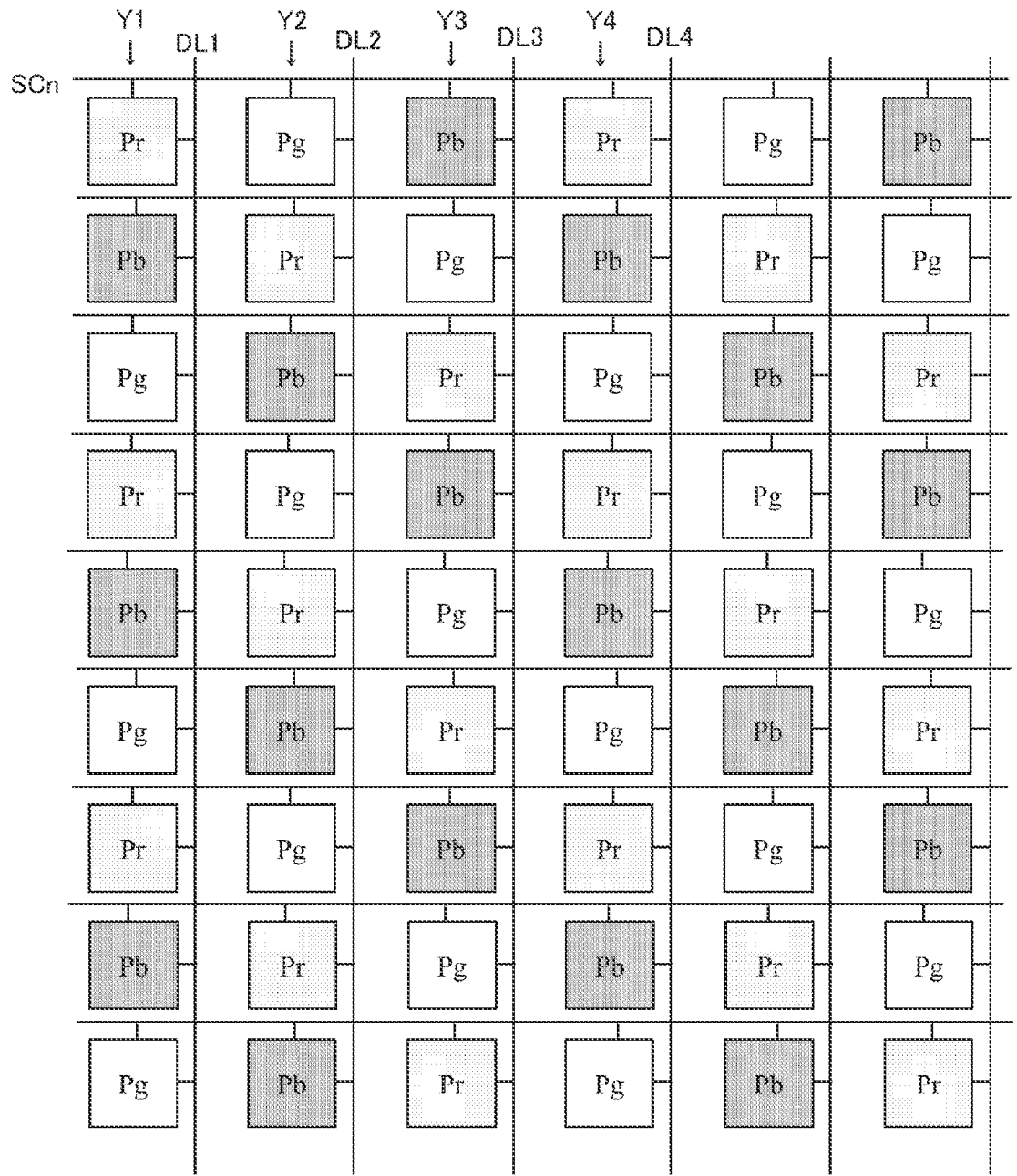
FIG. 2 schematically illustrates a sub-pixel arrangement in a first embodiment.

Hereinafter, a direction where data signal lines extend is defined as a column direction, and a direction where scan signal lines extend is defined as a row direction. FIG. 2 schematically illustrates a sub-pixel arrangement in a first embodiment. In FIG. 2, a plurality of sub-pixels are arranged in matrix, and a plurality of sub-pixels Pr, Pg, and Pb that emit different colors of light are connected to a scan signal line SCn for instance. The plurality of sub-pixels connected to each data signal line emit three colors of light; Four sequential data signal lines DL1, DL2, DL3, and DL4 (first to fourth data signal lines) are respectively connected to a sub-pixel column Y1, a sub-pixel column Y2, a sub-pixel column Y3, and a sub-pixel column Y4, each of which includes a plurality of red sub-pixels Pr, a plurality of blue sub-pixels Pb, and a plurality of green sub-pixels Pg.

To be specific, each of the four sub-pixel columns Y1, Y2, Y3, and Y4 sequentially arranged in a row direction includes a plurality of sub-pixels Pr, Pb, and Pg periodically arranged for each cycle consisting of a red sub-pixel Pr, a blue sub-pixel Pb, and a green sub-pixel Pg sequentially arranged in a column direction; in addition, referring to a phase indicating the order of sub-pixel colors, the phase in the sub-pixel column Y2, connected to the data signal line DL2, advances by a one-third cycle (that is, the phase is shifted downward by one sub-pixel) from the phase in the sub-pixel column Y1, connected to the data signal line DL1, and the phase in Y3, connected to the data signal line DL3, advances by a two-thirds cycle (that is, the phase is shifted downward by two sub-pixels) from the phase in the sub-pixel column Y1. Y4, connected to the data signal line DL4, has the same phase as the sub-pixel column Y1 (that is, the order of sub-pixel colors is the same).

For instance, adjacent sub-pixels belonging to a plurality of sub-pixels along the data signal line DL (connected to the data signal line DL1) emit different colors of light, and adjacent sub-pixels belonging to a plurality of sub-pixels along the data signal line DL2 (connected to the data signal line DL2) emit different colors of light. In addition, two adjacent sub-pixels one of which is connected to the data signal line DL and the other of which is connected to the data signal line DL2 emit different colors of light. It is noted that a wire other than a data signal line may be placed between the adjacent data signal lines DL1 and DL2.

Figure 3:
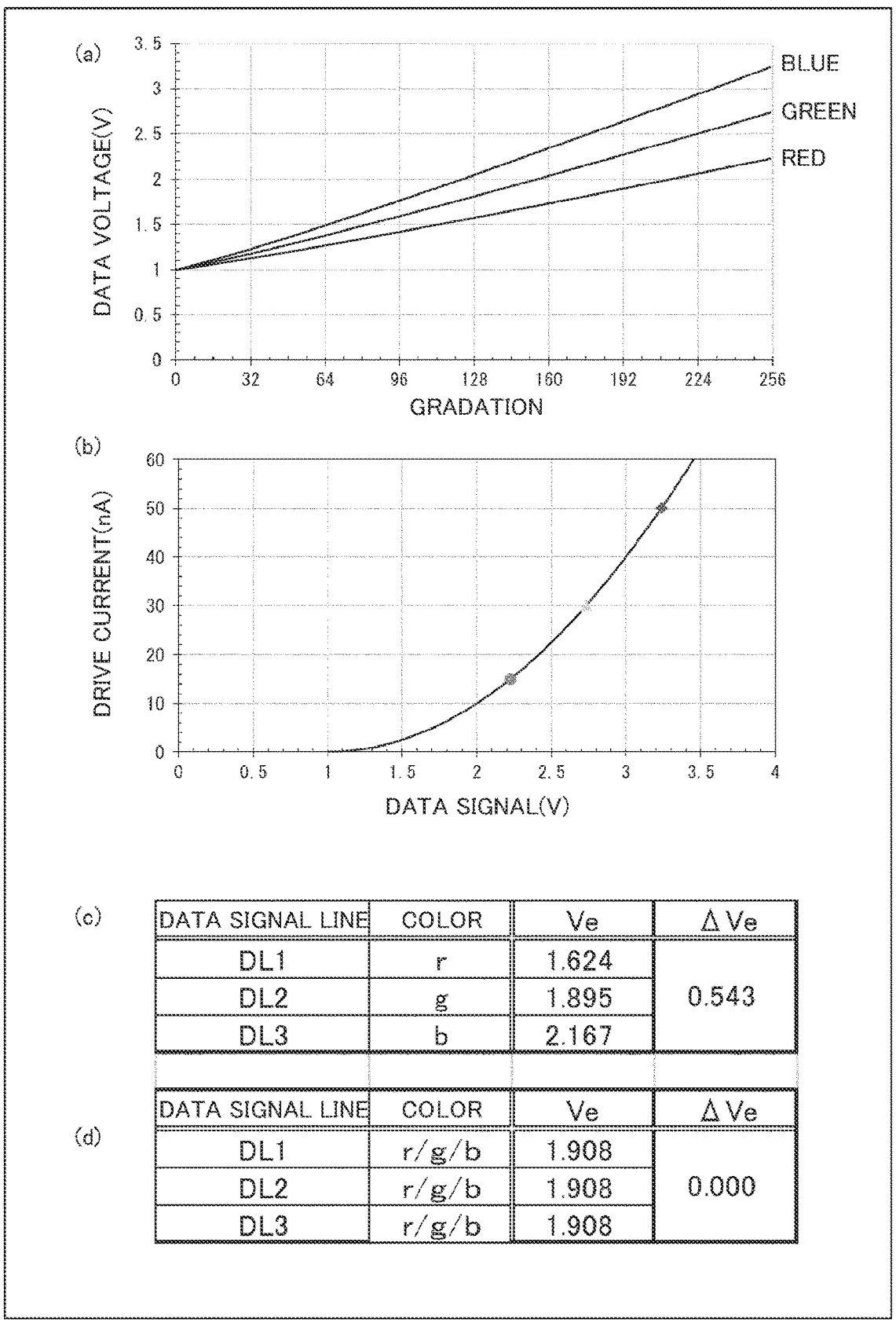
FIG. 3(a) is a graph showing the relationship between gradation and data signal.
FIG. 3(b) is a graph showing the relationship between data signal and drive current.
FIG. 3(c) is a table showing the effective voltage of each data signal line in a reference example.
FIG. 3(d) is a table showing the effective voltage of each data signal line in the first embodiment.
Figure 4:
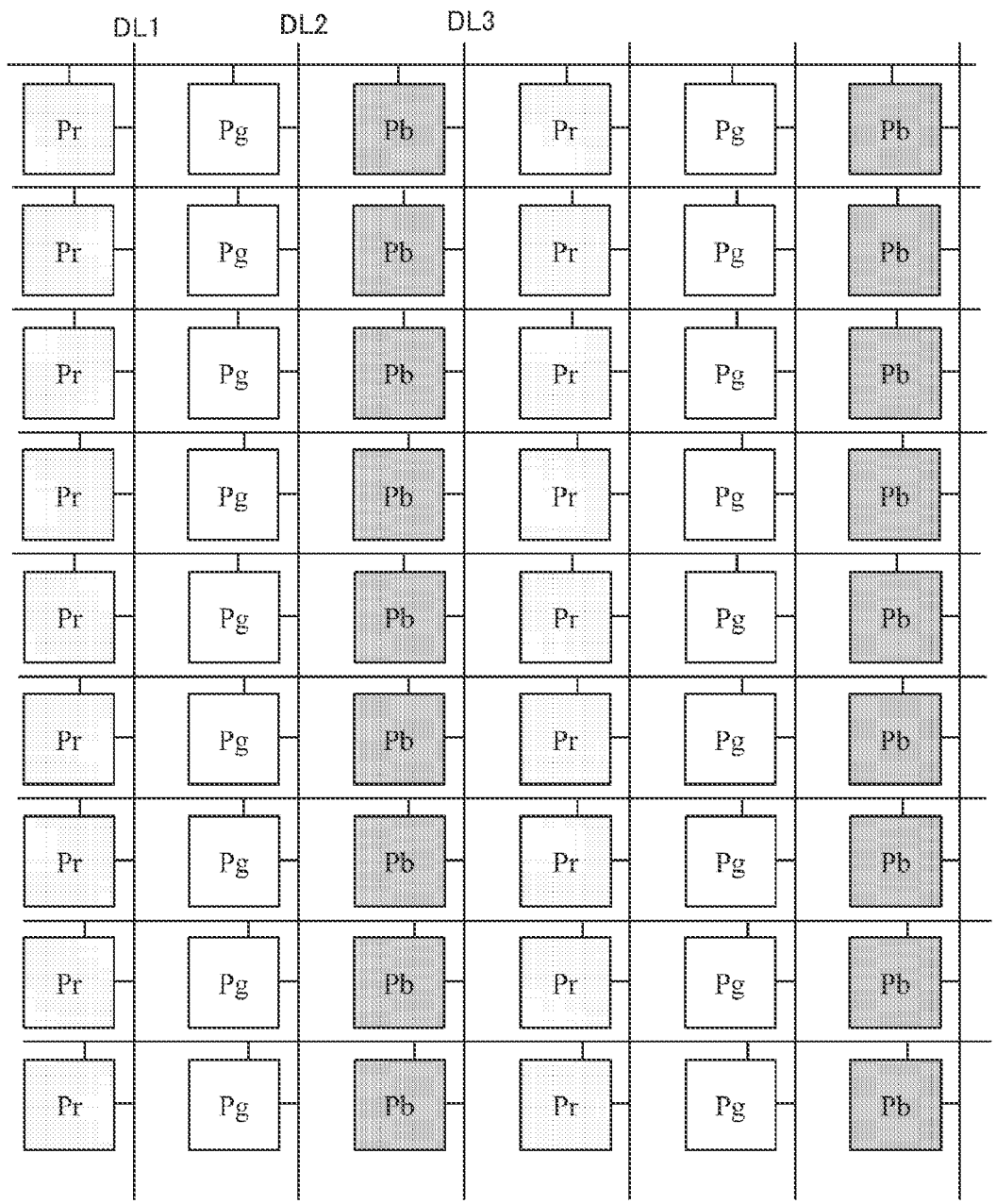
FIG. 4 schematically illustrates a sub-pixel arrangement in a comparative example.

In displaying the same gradation, data voltage (voltage across a data signal line) increases in the order of red, green, and blue sub-pixels, and current (drive current) through a drive transistor likewise increases in this order, as illustrated in FIGS. 3(a) and (b). Hence, when each sub-pixel column includes a plurality of sub-pixels of the same color, as illustrated in FIG. 4, effective voltage Ve increases, as shown in FIG. 3(c), in the order of the data signal line DL1 (to which a plurality of sub-pixels Pr are connected), the data signal line DL2 (to which a plurality of green sub-pixels Pg are connected), and the data signal line DL3 (to which a plurality of blue sub-pixels Pb are connected). Herein, the difference Δ in effective voltage between DL1 and DL3 is expresses as Ve=0.543 V. This easily degrades the write transistors Ts connected to the data signal line DL3.

The sub-pixel column connected to each data signal line (DL1, DL2, and DL3) accordingly includes a plurality of red sub-pixels Pr, a plurality of blue sub-pixels Pb, and a plurality of green sub-pixels Pg, as illustrated in FIG. 2, thus offering an equal effective voltage Ve between the data signal lines DL1, DL2, and DL3, as shown in FIG. 3(d). Herein, the difference Δ in effective voltage between DL1 and DL3 is expressed as Ve=0 V. This can improve problems in display quality resulting from degradation in the write transistors Ts connected to a particular data signal line (DL3 in FIG. 4).

Figure 5:
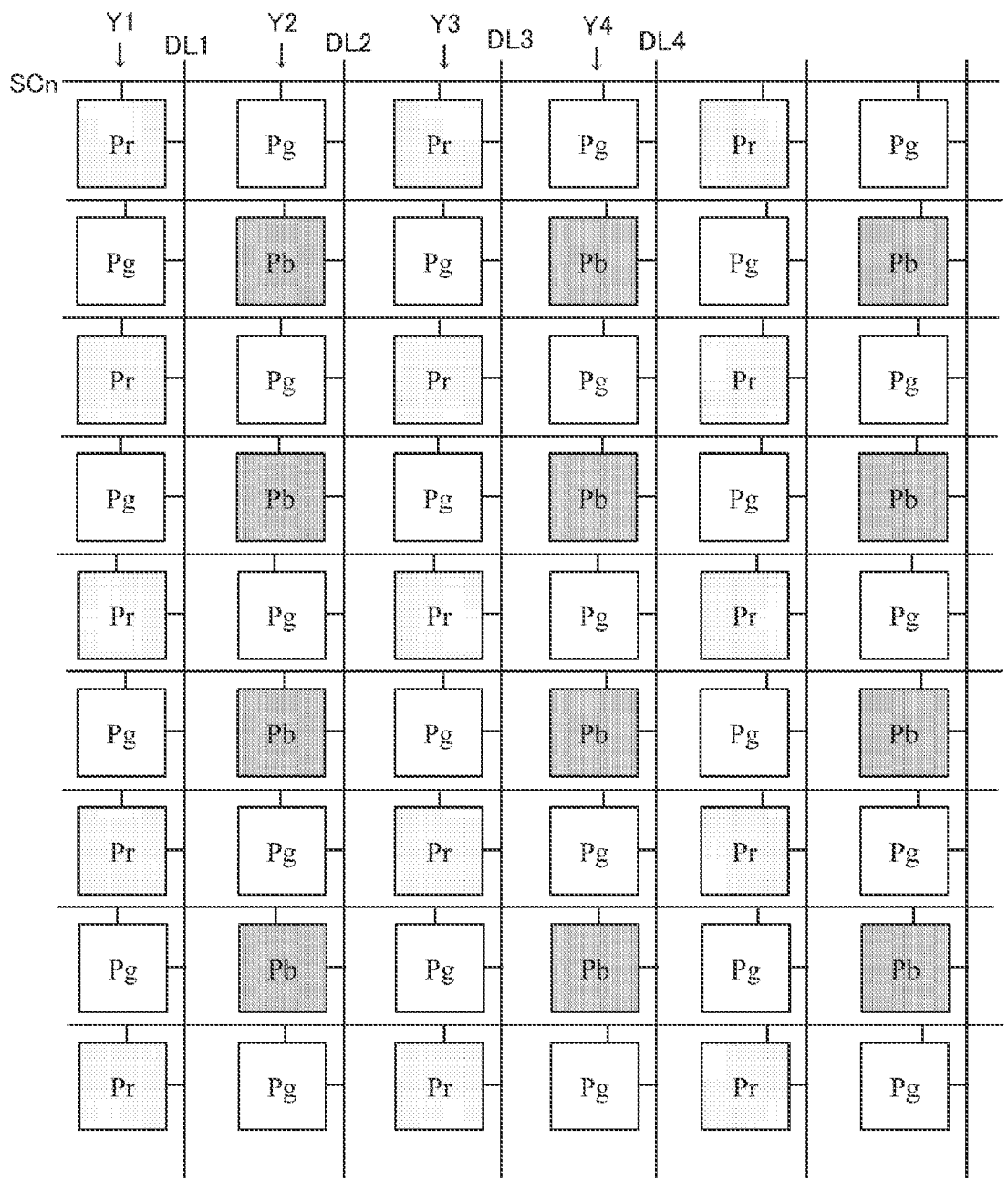
FIG. 5 schematically illustrates a sub-pixel arrangement in another example in the first embodiment.

FIG. 5 schematically illustrates a sub-pixel arrangement in another example in the first embodiment. FIG. 5 shows a plurality of sub-pixels arranged in matrix. FIG. 5 also shows two adjacent data signal lines DL1 and DL2 respectively connected to a sub-pixel column Y1 and a sub-pixel column Y2. The sub-pixel column Y1 includes a plurality of red sub-pixels Pr and a plurality of green sub-pixels Pg. The sub-pixel column Y2 includes a plurality of green sub-pixels Pg and a plurality of blue sub-pixels Pb. The ratio between the number of red sub-pixels Pr, the number of green sub-pixels Pg, and the number of blue sub-pixels Pb is expressed as 1:2:1.

To be specific, the drawing shows the two sequentially arranged sub-pixel columns Y1 and Y2 in a row direction, one of which, Y1, includes a plurality of sub-pixels Pr and Pg periodically arranged for each cycle consisting of a red sub-pixel Pr and a green sub-pixel Pg sequentially arranged in a column direction, and the other of which, Y2, includes a plurality of sub-pixels Pg and Pb periodically arranged for each cycle consisting of a green sub-pixel Pg and a blue sub-pixel Pb sequentially arranged in the column direction. In addition, two adjacent sub-pixels in the row direction emit different colors of light. That is, the green sub-pixels Pg are adjacent to the red sub-pixels Pr or the blue sub-pixels Pb in the row direction. The data signal lines DL1, DL2, DL3, and DL4 are sequentially provided, among which the data signal line DL3 is connected to a sub-pixel column Y3 having the same sub-pixel arrangement as the sub-pixel column Y1, and the data signal line DL4 is connected to a sub-pixel column Y4 having the same order of sub-pixel colors as the sub-pixel column Y2.

Providing each sub-pixel column with two colors of a plurality of sub-pixels as described above establishes a relationship where the effective voltage Ve of the data signal line DL1 (to which a plurality of red sub-pixels Pr and a plurality of green sub-pixels Pg are connected) is smaller than the effective voltage Ve of the data signal line DL2 (to which a plurality of green sub-pixels Pg and a plurality of blue sub-pixels Pb are connected). Herein, the difference Δ in effective voltage between DL1 and DL2 is expressed as Ve=0.291 V<0.543 V, as shown in FIG. 3(c). This can improve problems in display quality resulting from degradation in the write transistors Ts connected to a particular data signal line (DL3 in FIG. 4).

The result in FIG. 6(a) is based on an instance shown in FIG. 6(b), where the W/L ratio (ratio of channel width to channel length) of the drive transistor Td is common throughout the individual colors of sub-pixels, and where V255, signal voltage at the maximum gradation, and Vd, drive voltage (voltage between the gate and source of the drive transistor Td) at the maximum gradation, increase in the order of the red sub-pixel Pr, the green sub-pixel Pg, and the blue sub-pixel Pb.

In FIG. 6(c), the W/L ratio of the drive transistor Td increases in the order of the red sub-pixel Pr, the green sub-pixel Pg, and the blue sub-pixel Pb, thus enabling the signal voltage V255 at the maximum gradation and the drive voltage Vd at the maximum gradation to be common throughout the red sub-pixel Pr, the green sub-pixel Pg, and the blue sub-pixel Pb. This configuration in FIG. 6(c) enables the effective voltage Ve of the data signal line DL1 (to which the plurality of red sub-pixels Pr and the plurality of green sub-pixels Pg are connected) in FIG. 5 to be equal to the effective voltage Ve of the data signal line DL2 (to which the plurality of green sub-pixels Pg and the plurality of blue sub-pixels Pb are connected) in FIG. 5 (herein, the difference Δ in effective voltage between DL1 and DL2 is expressed as Ve=0 V), thereby preventing display quality resulting from degradation in the write transistors Ts connected to the data signal line DL2.

Second Embodiment

Figure 7:
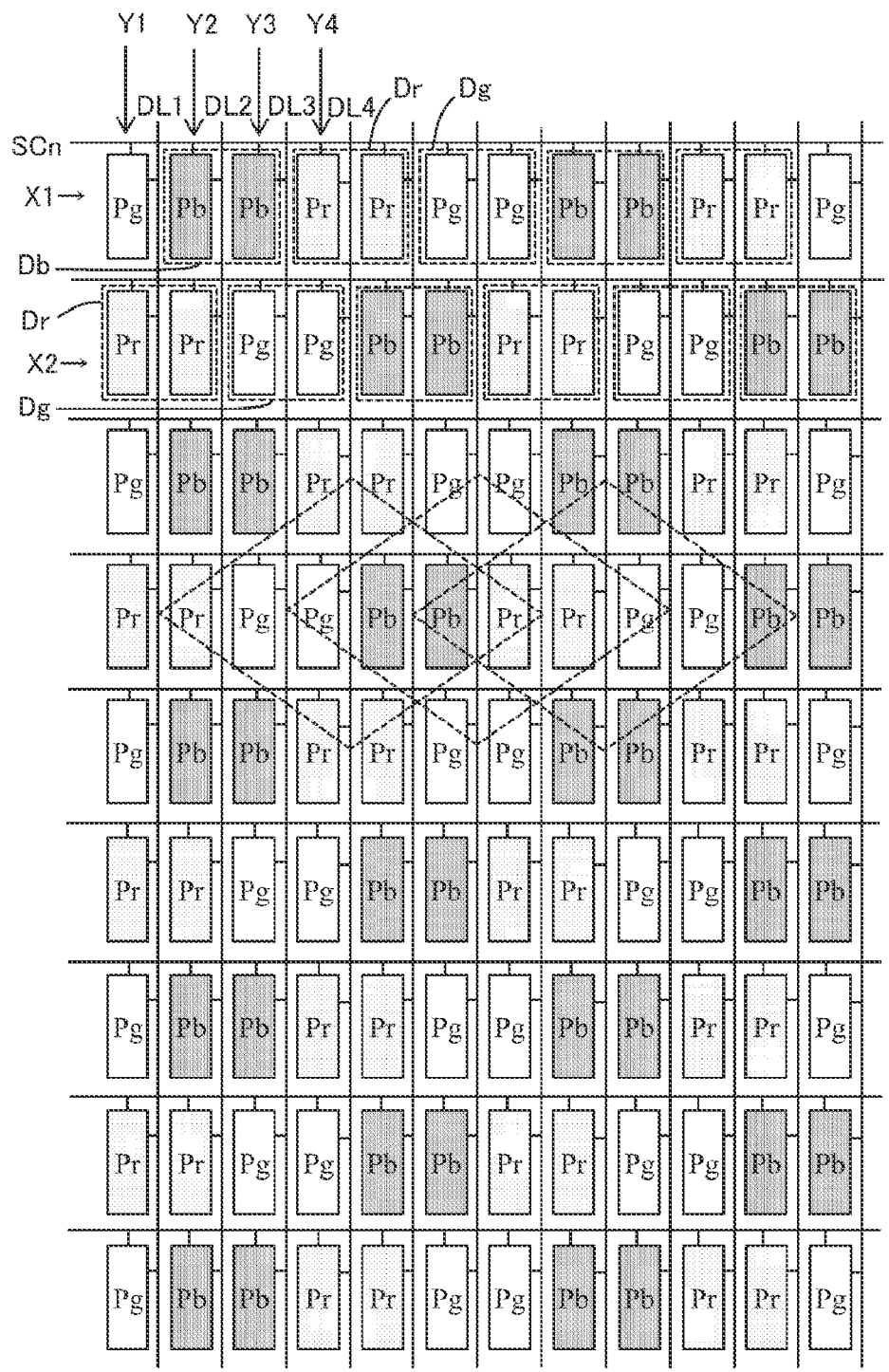
FIG. 7 schematically illustrates a sub-pixel arrangement in a second embodiment.

FIG. 7 schematically illustrates a sub-pixel arrangement in a second embodiment. In FIG. 7, a plurality of sub-pixels are arranged in matrix, and a plurality of sub-pixels Pr, Pg, and Pb that emit different colors of light are connected to a scan signal line SCn for instance. The plurality of sub-pixels connected to each data signal line emit two colors of light; Four sequential data signal lines DL1, DL2, DL3, and DL4 (first to fourth data signal lines) are respectively connected to a sub-pixel column Y1, a sub-pixel column Y2, a sub-pixel column Y3, and a sub-pixel column Y4. The sub-pixel column Y1 includes a plurality of red (first color) sub-pixels Pr and a plurality of green (second color) sub-pixels Pg. The sub-pixel column Y2 includes a plurality of red sub-pixels Pr and a plurality of blue (third color) sub-pixels Pb. The sub-pixel column Y3 includes a plurality of green sub-pixels Pg and a plurality of blue sub-pixels Pb. The sub-pixel column Y4 includes a plurality of green sub-pixels Pg and a plurality of red sub-pixels Pr.

To be specific, the drawing shows the four sequentially arranged sub-pixel columns Y1, Y2, Y3, and Y4 in a row direction, among which the sub-pixel column Y1 includes a plurality of sub-pixels Pg and Pr periodically arranged for each cycle consisting of a green sub-pixel Pg and a red sub-pixel Pr sequentially arranged in a column direction, the sub-pixel column Y2 includes a plurality of sub-pixels Pb and Pr periodically arranged for each cycle consisting of a blue sub-pixel Pb and a red sub-pixel Pr sequentially arranged in the column direction, the sub-pixel column Y3 includes a plurality of sub-pixels Pb and Pg periodically arranged for each cycle consisting of a blue sub-pixel Pb and a green sub-pixel Pg sequentially arranged in the column direction, and the sub-pixel column Y4 includes a plurality of sub-pixels Pr and Pg periodically arranged for each cycle consisting of a red sub-pixel Pr and a green sub-pixel Pg sequentially arranged in the column direction. In addition, sub-pixels having a color included in common in two adjacent sub-pixel columns are adjacent to each other, and these two adjacent sub-pixels of the same color in the row direction can be regarded as a dot (a red dot Dr, a green dot Dg, or a blue dot Db).

In FIG. 7, each sub-pixel row includes a plurality of dots periodically arranged for each cycle consisting of three colors of sequential dots Db, Dr, and Dg. In addition, referring to a phase indicating the order of dot colors, two adjacent sub-pixel row X1 and X2 have phases shifted by a half cycle (by three sub-pixels). The drawing also shows, as denoted by three diamond-shaped broken lines, that the distance between the centers of the red dots Dr closest to each other, the distance between the centers of the blue dots Db closest to each other, and the distance between the centers of the green dots Dg closest to each other are equal.

In FIG. 7, the sub-pixels Pr corresponding to the data signal line DL1 and emitting red light are adjacent to the sub-pixels Pr corresponding to the data signal line DL2 and emitting red light; in addition, the sub-pixels Pg corresponding to the data signal line DL3 and emitting green light are adjacent to the sub-pixels Pg corresponding to the data signal line DL4 and emitting green light; in addition, the sub-pixels Pb corresponding to the data signal line DL2 and emitting blue light are adjacent to the sub-pixels Pb corresponding to the data signal line DL3 and emitting blue light.

Figure 8:
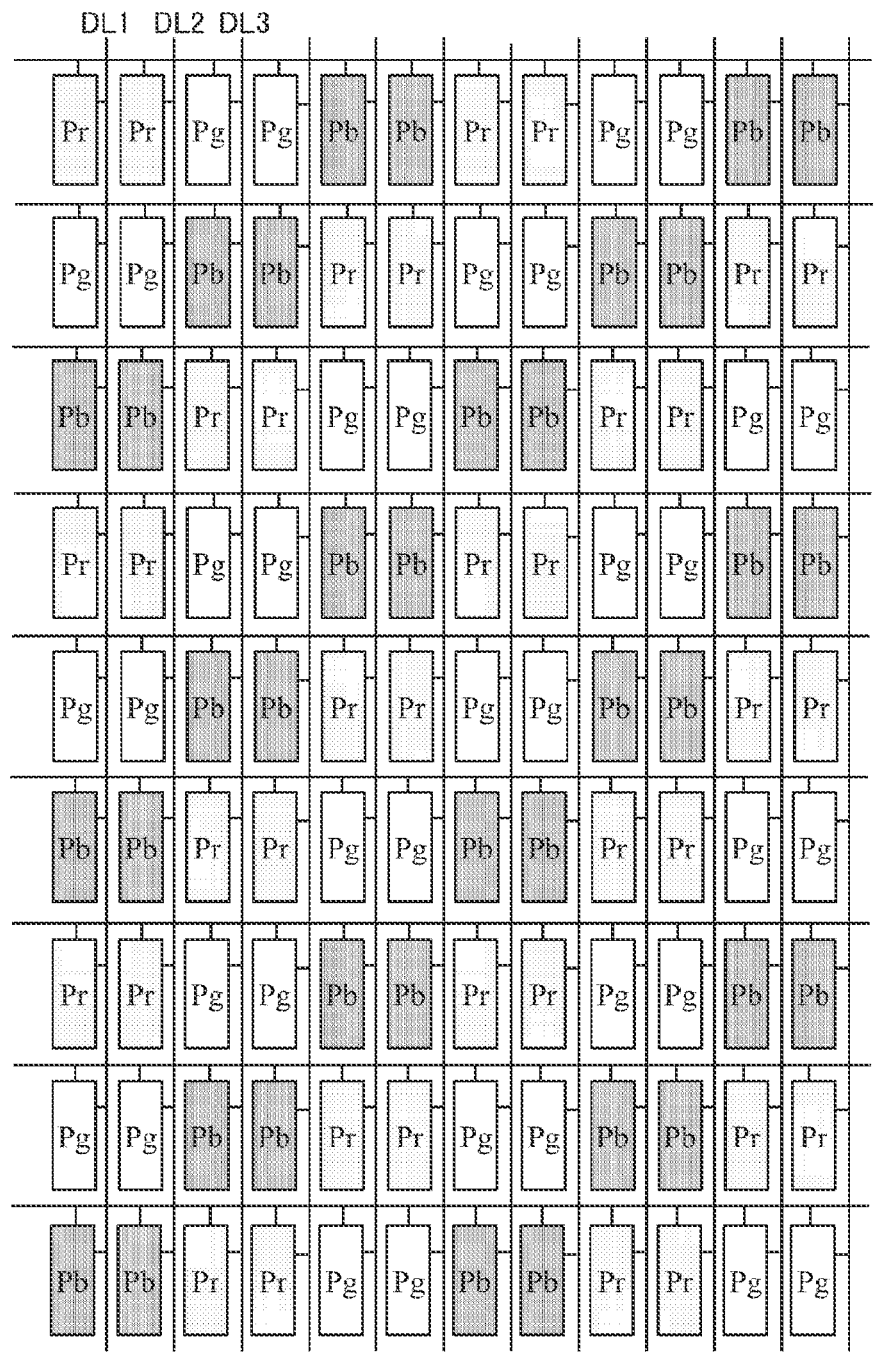
FIG. 8 schematically illustrates a sub-pixel arrangement in a comparative example.

The second embodiment can reduce stripe-shaped display unevenness in an oblique direction when compared to a reference example as shown in FIG. 8, where sub-pixels of the same color are arranged in an oblique direction.

Figure 9:
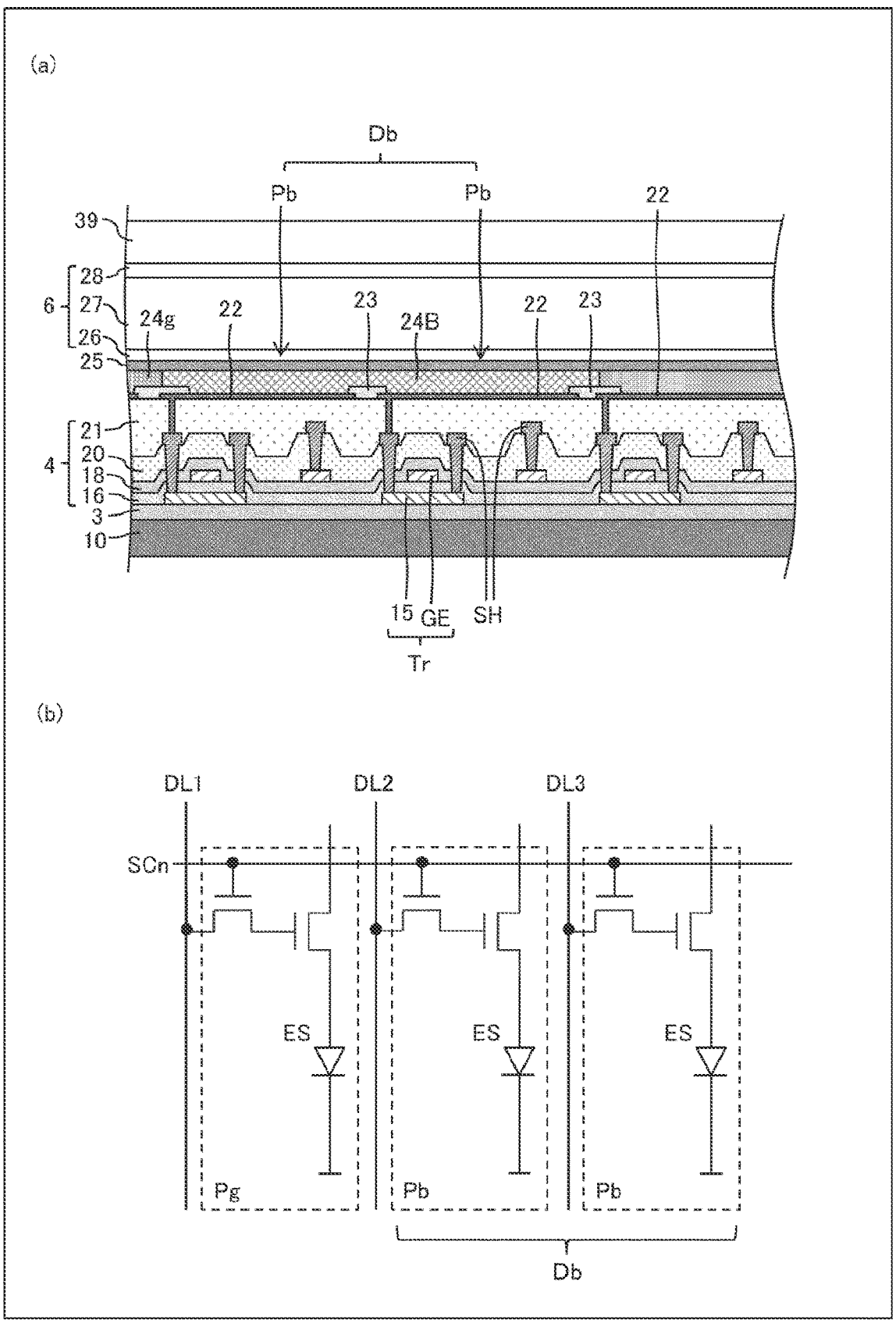
FIG. 9(a) is a cross-sectional view of a dot configuration in the second embodiment.
FIG. 9(b) is a circuit diagram of the dot configuration.

Two sub-pixels constituting each color of a dot have an EL layer (a light-emitting layer formed through evaporation in particular) in common and have a separated anode individually, thereby offering multi-gradation display without changing evaporation density (the density of openings of an FMM used in evaporation). For instance, referring to two adjacent sub-pixels Pb in FIGS. 7 and 9, which constitute a blue dot Db, the anode 22 is separated by the edge cover 23 whereas an EL layer 24B is shared by these sub-pixels. One of the two sub-pixels Pb is connected to the data signal line DL2, and the other is connected to the data signal line DL3.

Figure 10:
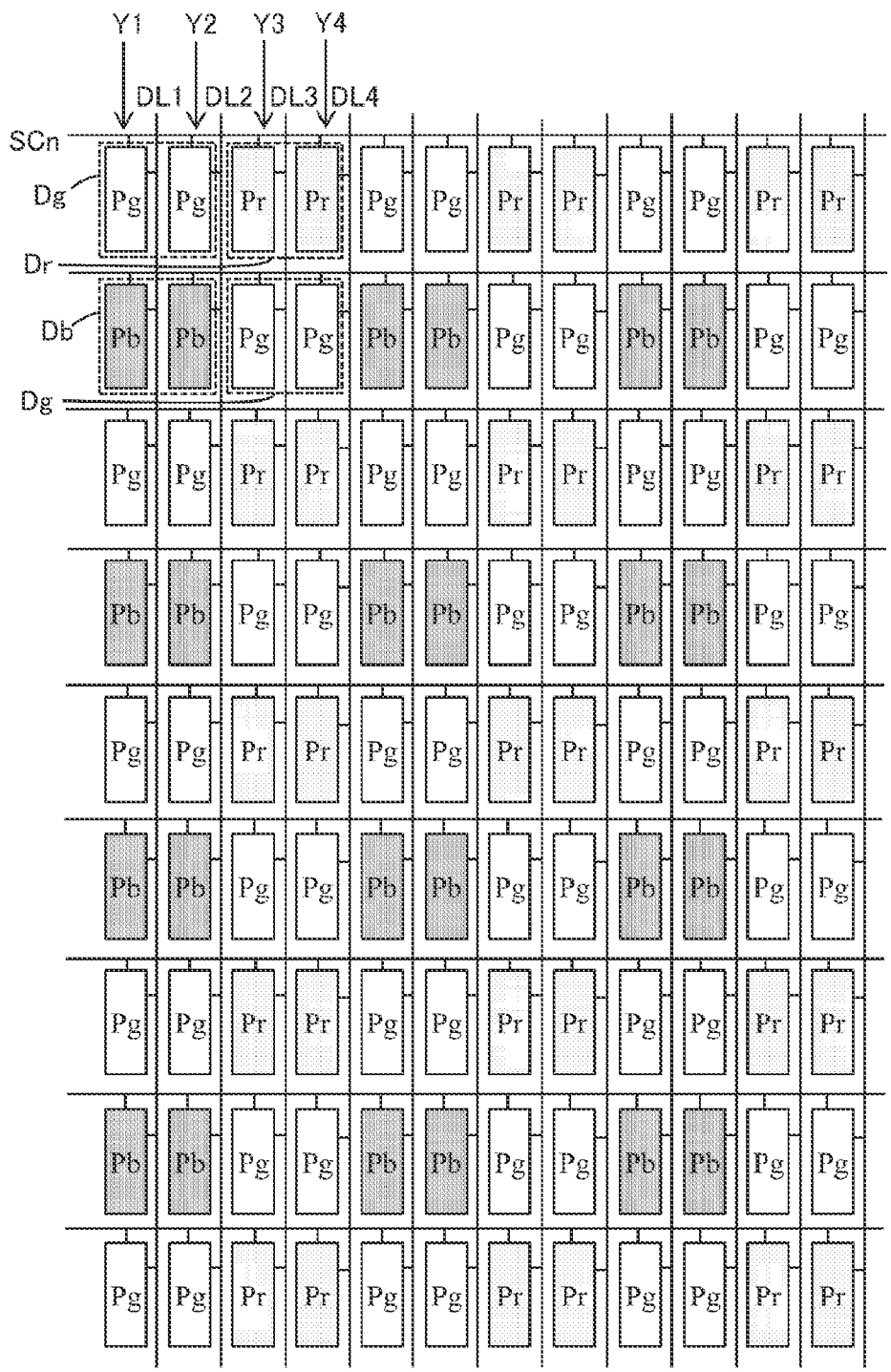
FIG. 10 schematically illustrates a sub-pixel arrangement in another example in the second embodiment.

FIG. 10 schematically illustrates a sub-pixel arrangement in another example in the second embodiment. In FIG. 10, a plurality of sub-pixels are arranged in matrix, and a plurality of sub-pixels Pr and Pg that emit different colors of light are connected to a scan signal line SCn for instance. The plurality of sub-pixels connected to each data signal line emit two colors of light; Four sequential data signal lines DL1, DL2, DL3, and DL4 are respectively connected to a sub-pixel column Y1, a sub-pixel column Y2, a sub-pixel column Y3 adjacent to the sub-pixel column Y2, and a sub-pixel column Y4. The sub-pixel column Y1 includes a plurality of green sub-pixels Pg and a plurality of blue sub-pixels Pb. The sub-pixel column Y2 includes a plurality of green sub-pixels Pg and a plurality of blue sub-pixels Pb. The sub-pixel column Y3 includes a plurality of red sub-pixels Pr and a plurality of green sub-pixels Pg. The sub-pixel column Y4 includes a plurality of red sub-pixels Pr and a plurality of green sub-pixels Pg. The ratio between the number of red sub-pixels Pr, the number of green sub-pixels Pg, and the number of blue sub-pixels Pb is expressed as 1:2:1.

To be specific, the drawing shows the four sequentially arranged sub-pixel columns Y1, Y2, Y3, and Y4 in a row direction, among which the sub-pixel column Y1 includes a plurality of sub-pixels Pg and Pb periodically arranged for each cycle consisting of a green sub-pixel Pg and a blue sub-pixel Pb sequentially arranged in a column direction, the sub-pixel column Y2 includes a plurality of sub-pixels Pg and Pb periodically arranged for each cycle consisting of a green sub-pixel Pg and a blue sub-pixel Pb sequentially arranged in the column direction, the sub-pixel column Y3 includes a plurality of sub-pixels Pr and Pg periodically arranged for each cycle consisting of a red sub-pixel Pr and a green sub-pixel Pg sequentially arranged in the column direction, and the sub-pixel column Y4 includes a plurality of sub-pixels Pr and Pg periodically arranged for each cycle consisting of a red sub-pixel Pr and a green sub-pixel Pg sequentially arranged in the column direction. In two adjacent sub-pixel columns having the same sub-pixel color combination, sub-pixels having a color included in common in these two sub-pixel columns are adjacent to each other, and these two adjacent sub-pixels of the same color in the row direction can be regarded as a dot (a red dot Dr, a green dot Dg, or a blue dot Db).

In FIG. 10, one of the two adjacent sub-pixel rows includes a plurality of dots periodically arranged for each cycle consisting of two colors of sequential dots Dg and Dr, and the other sub-pixel column includes a plurality of dots periodically arranged for each cycle consisting of two colors of sequential dots Db and Dg; in addition, two adjacent dots in the column direction have different colors. The drawing also shows that the distance between the centers of the red dots Dr closest to each other and the distance between the centers of the blue dots Db closest to each other are equal.

In FIG. 10, the sub-pixels Pb corresponding to the data signal line DL and emitting blue light are adjacent to the sub-pixels Pb corresponding to the data signal line DL2 and emitting blue light; in addition, the sub-pixels Pg corresponding to the data signal line DL3 and emitting green light are adjacent to the sub-pixels Pg corresponding to the data signal line DL4 and emitting green light; in addition, the sub-pixels Pg corresponding to the data signal line DL2 and emitting green light are adjacent to the sub-pixels Pr corresponding to the data signal line DL3 and emitting red light.

Third Embodiment

Figure 11:
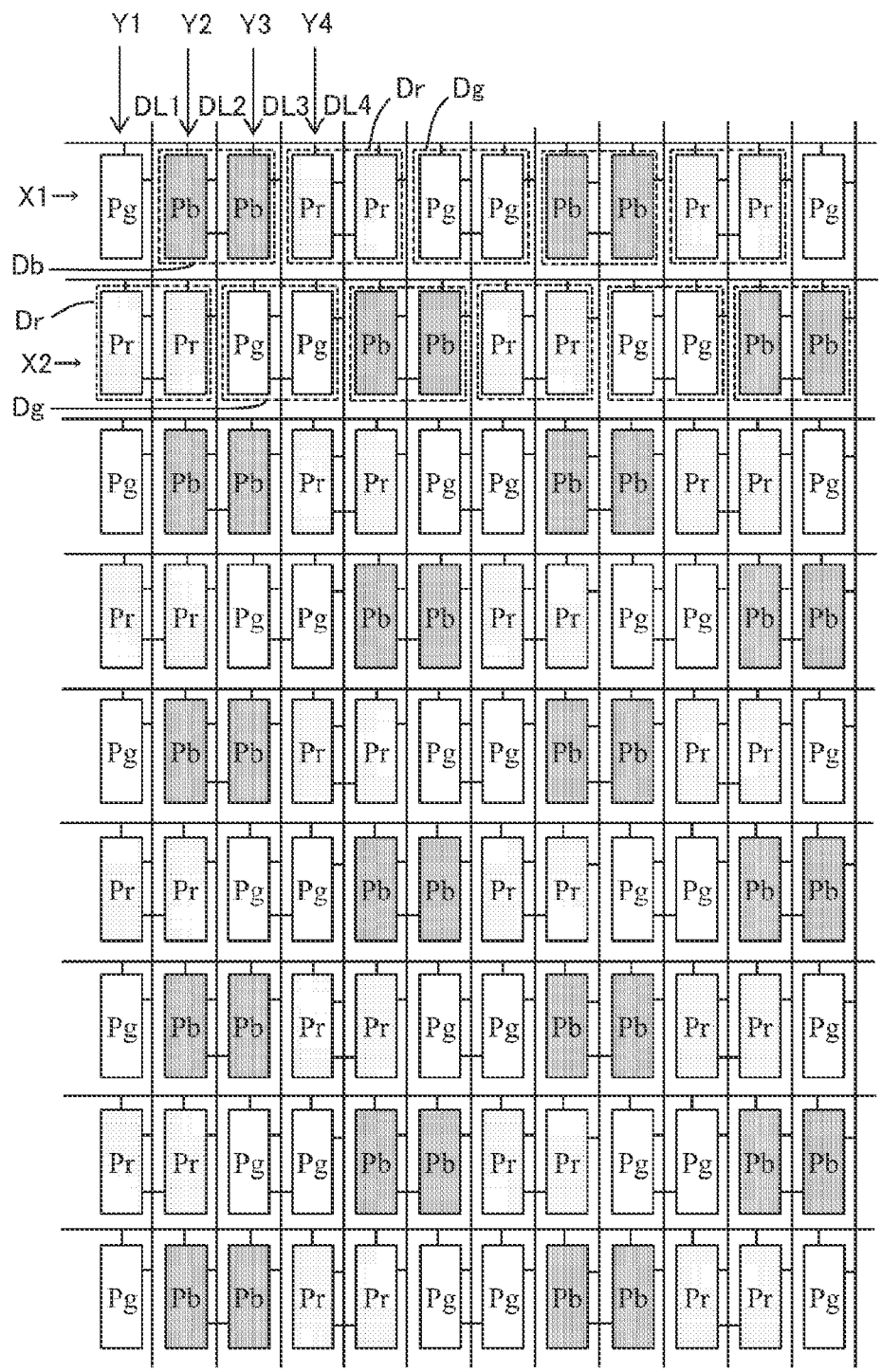
FIG. 11 schematically illustrates a sub-pixel arrangement in a third embodiment.
Figure 12:
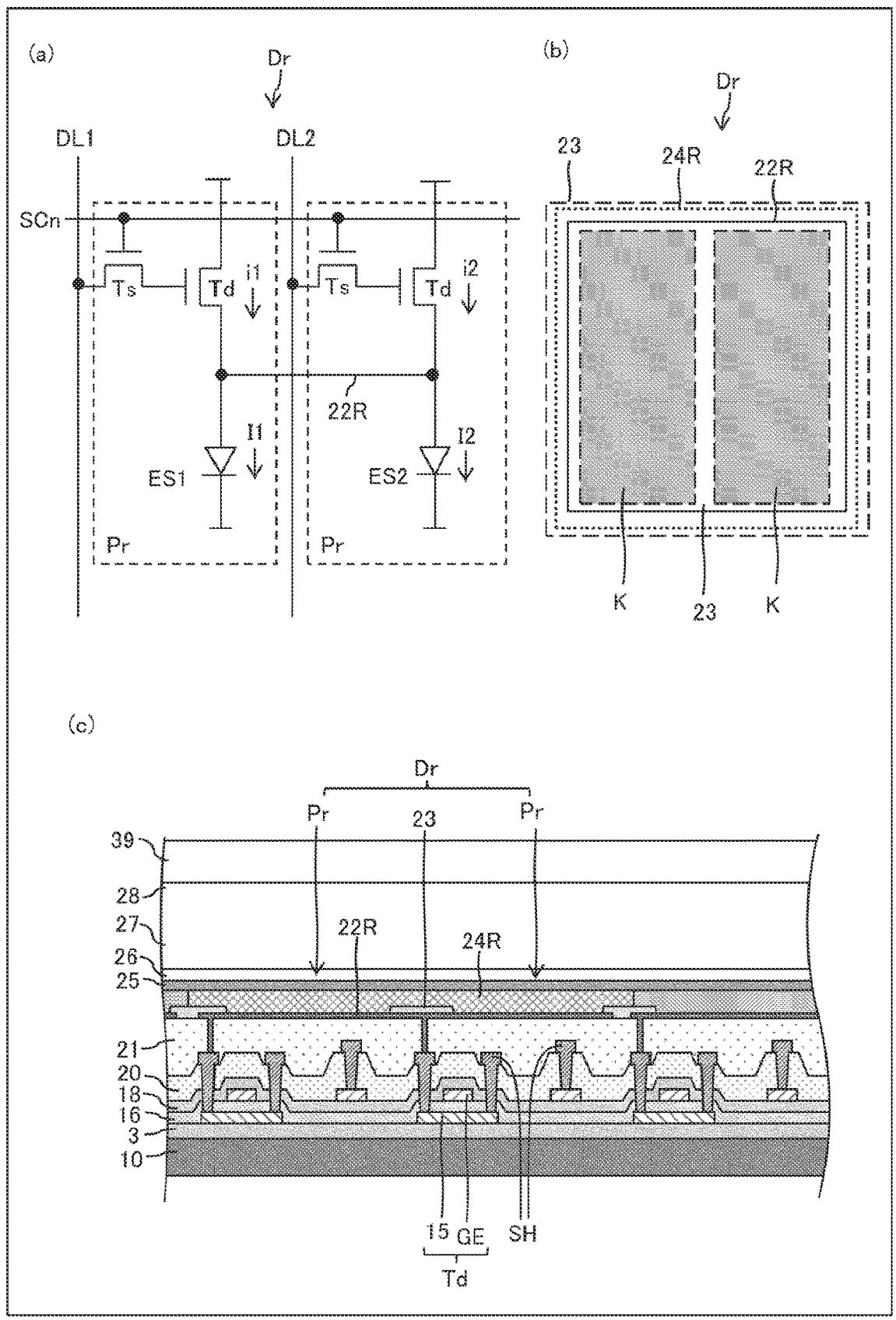
FIG. 12(a) is a circuit diagram of a dot configuration in the third embodiment.
FIG. 12(b) is a plan view of the dot configuration.
FIG. 12(c) is a cross-sectional view of the dot configuration.

FIG. 11 schematically illustrates a sub-pixel arrangement in a third embodiment. FIG. 12($a$) is a circuit diagram of a dot; FIG. 12($b$), a plan view of the dot; and FIG. 12($c$), a cross-sectional view of the dot.

FIGS. 11 and 12 show that two sub-pixels constituting each dot (Dr, Dg, and Db) are connected together, in the sub-pixel arrangement shown in FIG. 7. For a red dot Dr in FIG. 12 for instance, two sub-pixels Pr constituting the red dot Dr have in common an island-shaped anode 22R and an island-shaped EL layer 24R covering this anode. The edge cover 23 has two openings K overlapping the anode 22R. The openings K correspond to a light-emitting region.

Here, the drive transistor Td of one of two sub-pixels Pr is supplied with a current i1 based on a signal voltage from a data signal line DL1, and the drive transistor Td of the other sub-pixel Pr is supplied with a current i2 based on a signal voltage from the data signal line DL2. In addition, one of the two sub-pixels Pr has a light-emitting element ES1 through which a current I1 flows, and the other sub-pixel Pr has a light-emitting element ES2 through which a current I2 flows. The sum of the currents I1 and I2 is substantially equal to the sum of the currents i1 and i2, and I1≈I2 is satisfied. This can reduce variations in the properties of the two light-emitting elements ES1 and ES2 within the dot.

For instance, when the current i2 is extremely greater than the current i1, the current I2 through the light-emitting element ES2 is smaller than the current i2 (that is, the luminance of the light-emitting element ES2 is lower than it is originally). This can reduce degradation in the light-emitting element ES2. Herein, the current I1 is greater than the current i1 (that is, the luminance of the light-emitting element ES1 is higher than it is originally), thus maintaining the luminance of the dot Dr.

Even in the presence of a defect (no lighting), which means no current flows through the light-emitting element ES1, the current I2 through the light-emitting element ES2 is greater than the current i2 (that is, the luminance of the light-emitting element ES2 is higher than it is originally), thus maintaining the luminance of the dot Dr.

Figure 13:
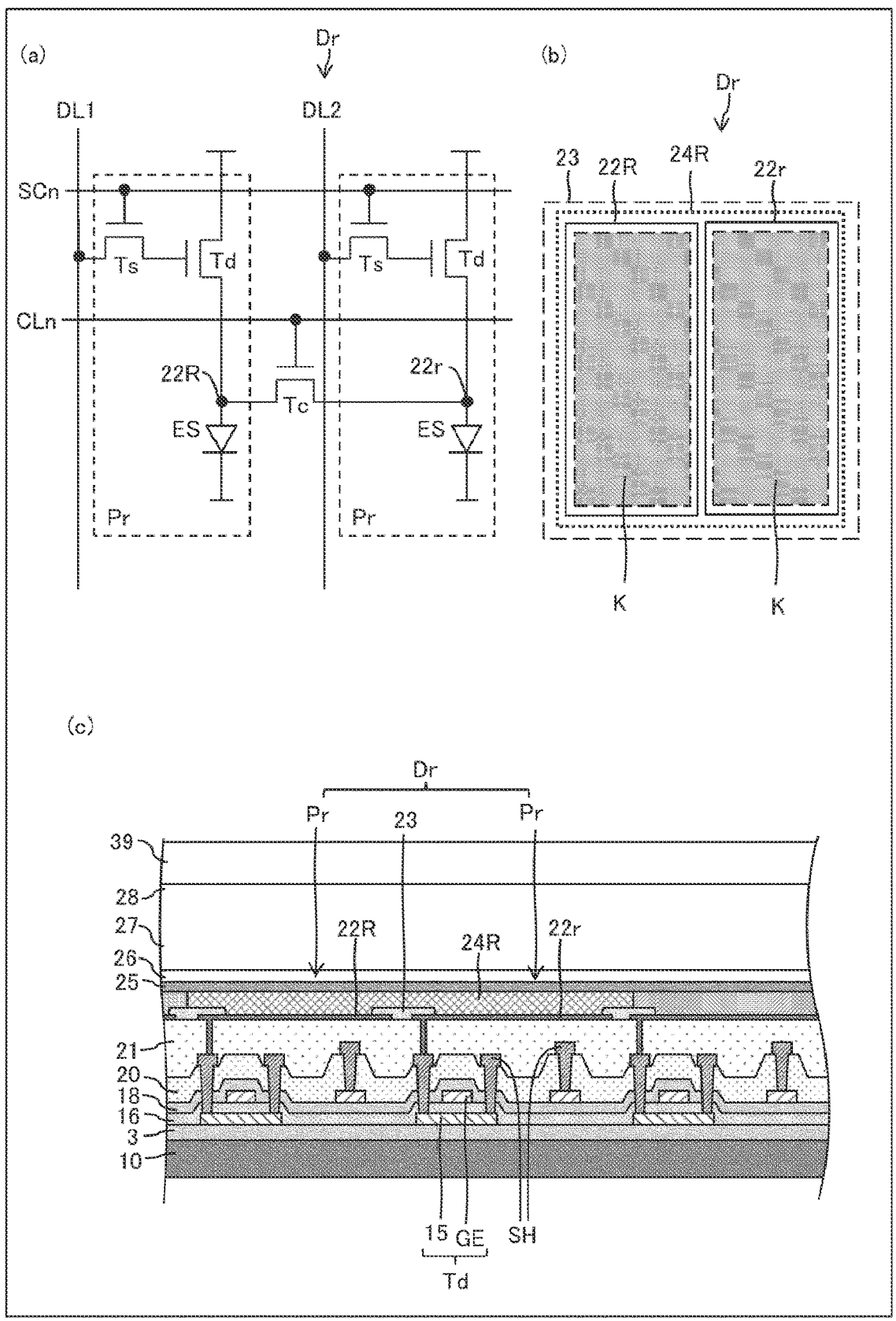
FIG. 13(a) is a circuit diagram of a dot configuration in another example in the third embodiment.
FIG. 13(b) is a plan view of the dot configuration.
FIG. 13(c) is a cross-sectional view of the dot configuration.

FIG. 13 schematically illustrates a sub-pixel arrangement in another example in the third embodiment. FIG. 13(*a*) is a circuit diagram of a dot; FIG. 13(*b*), a plan view of the dot; and FIG. 13(*c*), a cross-sectional view of the dot.

FIG. 13 shows that two sub-pixels constituting each dot (Dr, Dg, and Db) are connected together via a connecting transistor Tc, in the sub-pixel arrangement shown in FIG. 7. For a red dot Dr in FIG. 13 for instance, two sub-pixels Pr constituting the red dot Dr have anodes 22R and 22*r* electrically isolated from each other, and an island-shaped EL layer 24R (common layer) covering the anodes 22R and 22*r*. The edge cover 23 has an opening K overlapping the anode 22R and an opening K overlapping the anode 22*r*. Each opening K corresponds to a light-emitting region. The anodes 22R and 22*r* are connected together via the connecting transistor Tc. The connecting transistor Tc has a gate electrode connected to a control line CLn.

Figure 14:
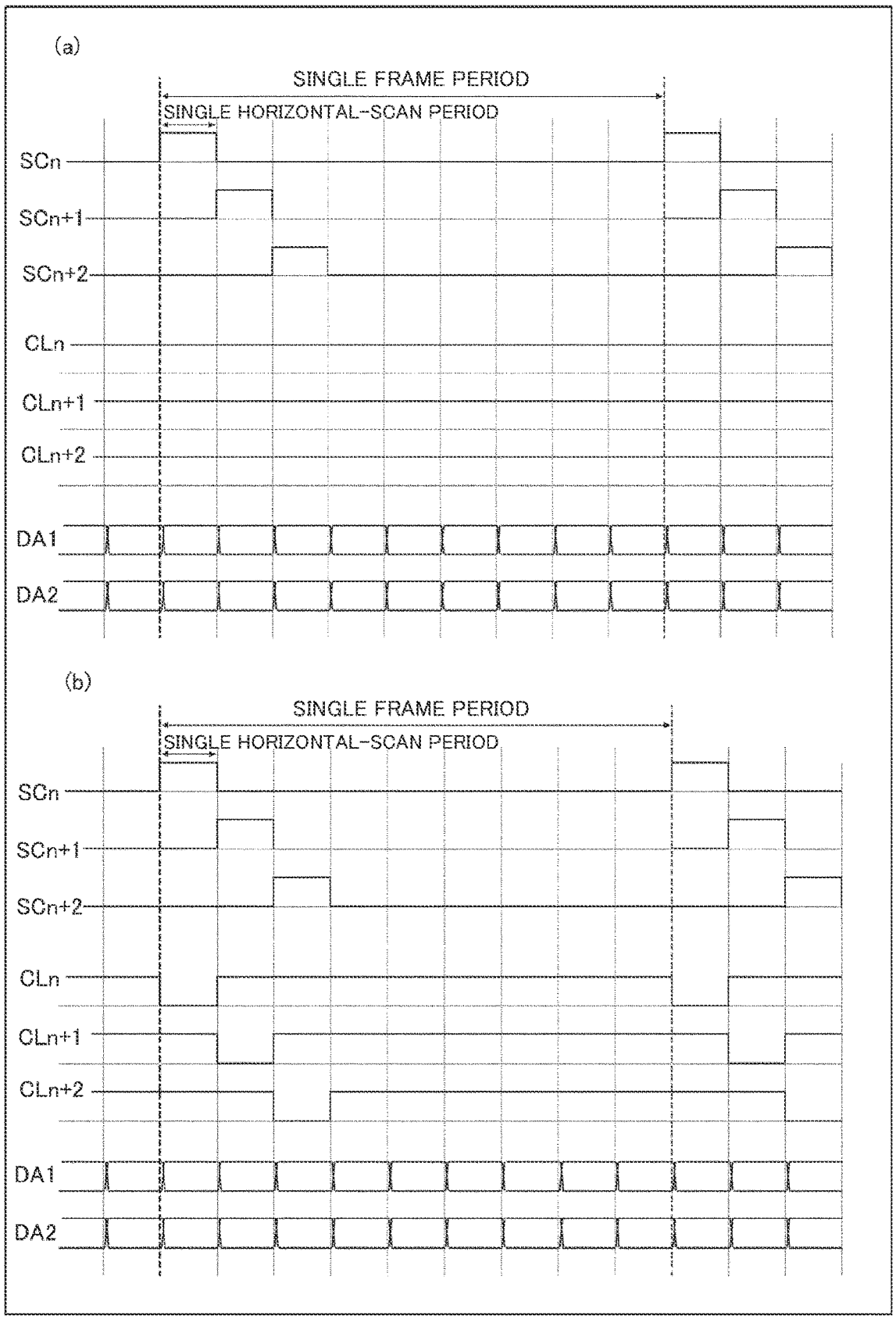
FIGS. 14(a) and (b) are timing charts illustrating the signal waveform of a scan signal line and the signal waveform of a control line.

FIGS. 14(*a*) and (*b*) are timing charts showing the signal waveforms of three sequential scan signal lines (SCn, SCn+1, and SCn+2), the signal waveforms of three sequential control lines (CLn, CLn+1, and CLn+2), and data rows DA1 and DA2 corresponding to the data signal lines DL1 and DL2.

The control line CLn may be supplied with a signal for keeping the transistor Tc always ON, as illustrated in FIG. 14(*a*). Alternatively, the control line CLn may be supplied with a signal for turning off the connecting transistor Tc during only a period when the scan signal line SCn is selected (i.e., a period during which the write transistor Ts remains ON), and for keeping the connecting transistor Tc ON during the other periods.

SUMMARY

First Aspect

A display device includes a plurality of data signal lines, a plurality of scan signal lines, and a plurality of sub-pixels. Each of the plurality of sub-pixels includes a light-emitting element, a write transistor connected to one of the plurality of data signal lines, and a drive transistor that controls a current that flows through the light-emitting element. The plurality of data signal lines include a first data signal line and a second data signal line adjacent to the first data signal line. The plurality of sub-pixels arranged along the first data signal line include adjacent sub-pixels that emit different colors of light, and each include the write transistor having a conduction terminal electrically connected to the first data signal line. The plurality of sub-pixels arranged along the second data signal line include adjacent sub-pixels that emit different colors of light, and each include the write transistor having a conduction terminal electrically connected to the second data signal line.

Second Aspect

In the display device according to, for instance, the first aspect, the first and second data signal lines are both electrically connected to the conduction terminal of the write transistor of the sub-pixel that emits blue light, the conduction terminal of the write transistor of the sub-pixel that emits red light, and the conduction terminal of the write transistor of the sub-pixel that emits green light.

Third Aspect

In the display device according to, for instance, the second aspect, the sub-pixel disposed along the first data signal line and the sub-pixel disposed along the second data signal line and adjacent to the sub-pixel disposed along the first data signal line emit different colors of light.

Fourth Aspect

In the display device according to, for instance, the first aspect, the first data signal line is electrically connected to the conduction terminal of the write transistor of the sub-pixel that emits red light and the conduction terminal of the write transistor of the sub-pixel that emits green light. The second data signal line is electrically connected to the conduction terminal of the write transistor of the sub-pixel that emits blue light and the conduction terminal of the write transistor of the sub-pixel that emits green light.

Fifth Aspect

In the display device according to, for instance, the fourth aspect, the drive transistor of the sub-pixel that emits blue light has a channel length shorter than a channel length of the drive transistor of the sub-pixel that emits red light and a channel length of the drive transistor of the sub-pixel that emits green light.

Sixth Aspect

In the display device according to, for instance, the fourth aspect, the drive transistor of the sub-pixel that emits blue light has a channel width longer than a channel width of the drive transistor of the sub-pixel that emits red light and a channel width of the drive transistor of the sub-pixel that emits green light.

Seventh Aspect

In the display device according to, for instance, the first aspect, the plurality of data signal lines further include a third data signal line adjacent to the second data signal line, and a fourth data signal line adjacent to the third data signal line. The plurality of sub-pixels arranged along the third data signal line include adjacent sub-pixels that emit different colors of light, and each include the write transistor having a conduction terminal electrically connected to the third data signal line. The plurality of sub-pixels arranged along the fourth data signal line include adjacent sub-pixels that emit different colors of light, and each include the write transistor having a conduction terminal electrically connected to the fourth data signal line.

Eighth Aspect

In the display device according to, for instance, the seventh aspect, the first data signal line is electrically connected to the conduction terminal of the write transistor of the sub-pixel that emits a first color of light and the conduction terminal of the write transistor of the sub-pixel that emits a second color of light. The second data signal line is electrically connected to the conduction terminal of the write transistor of the sub-pixel that emits the first color of light and the conduction terminal of the write transistor of the sub-pixel that emits a third color of light. The third data signal line is electrically connected to the conduction terminal of the write transistor of the sub-pixel that emits the second color of light and the conduction terminal of the write transistor of the sub-pixel that emits the third color of light. The fourth data signal line is electrically connected to the conduction terminal of the write transistor of the sub-pixel that emits the first color of light and the conduction terminal of the write transistor of the sub-pixel that emits the second color of light. The sub-pixel connected to the first data signal line and emitting the first color of light is adjacent to the sub-pixel connected to the second data signal line and emitting the first color of light. The sub-pixel connected to the third data signal line and emitting the second color of light is adjacent to the sub-pixel connected to the fourth data signal line and emitting the second color of light. The sub-pixel connected to the second data signal line and emitting the third color of light is adjacent to the sub-pixel connected to the third data signal line and emitting the third color of light.

Ninth Aspect

In the display device according to, for instance, the eighth aspect, the light-emitting element included in the sub-pixel connected to the first data signal line and emitting the first color of light has a first electrode electrically connected to a first electrode of the light-emitting element included in the sub-pixel connected to the second data signal line and emitting the first color of light.

Tenth Aspect

In the display device according to, for instance, the eighth aspect, the light-emitting element included in the sub-pixel connected to the first data signal line and emitting the first color of light has a first electrode electrically connected, via a transistor, to a first electrode of the light-emitting element included in the sub-pixel connected to the second data signal line and emitting the first color of light.

Eleventh Aspect

In the display device according to, for instance, the seventh aspect, the first data signal line is electrically connected to the conduction terminal of the write transistor of the sub-pixel that emits a first color of light and the conduction terminal of the write transistor of the sub-pixel that emits a second color of light. The second data signal line is electrically connected to the conduction terminal of the write transistor of the sub-pixel that emits the first color of light and the conduction terminal of the write transistor of the sub-pixel that emits the second color of light. The third data signal line is electrically connected to the conduction terminal of the write transistor of the sub-pixel that emits the second color of light and the conduction terminal of the write transistor of the sub-pixel that emits a third color of light. The fourth data signal line is electrically connected to the conduction terminal of the write transistor of the sub-pixel that emits the second color of light and the conduction terminal of the write transistor of the sub-pixel that emits the third color of light. The sub-pixel connected to the first data signal line and emitting the first color of light is adjacent to the sub-pixel connected to the second data signal line and emitting the first color of light. The sub-pixel connected to the third data signal line and emitting the second color of light is adjacent to the sub-pixel connected to the fourth data signal line and emitting the second color of light. The sub-pixel connected to the second data signal line and emitting the second color of light is adjacent to the sub-pixel connected to the third data signal line and emitting the third color of light.

Twelfth Aspect

A display device includes a plurality of data signal lines extending in a column direction, a plurality of scan signal lines extending in a row direction, and a plurality of sub-pixels arranged in matrix. Each of the plurality of sub-pixels includes a light-emitting element, a write transistor connected to one of the plurality of data signal lines, and a drive transistor that controls a current that flows through the light-emitting element. Each of the plurality of sub-pixels is connected to one of the plurality of scan signal lines. The plurality of sub-pixels that emit different colors of light are connected to each of the plurality of scan signal lines. The plurality of sub-pixels that emit different colors of light are connected to each of the plurality of data signal lines.

Thirteenth Aspect

In the display device according to, for instance, the twelfth aspect, the plurality of sub-pixels connected to each of the plurality of data signal lines emit three colors of light.

Fourteenth Aspect

In the display device according to, for instance, the twelfth aspect, the plurality of sub-pixels connected to each of the plurality of data signal lines emit two colors of light.

Fifteenth Aspect

In the display device according to, for instance, the fourteenth aspect, each of the plurality of scan signal lines is connected to a sub-pixel row consisting of the plurality of sub-pixels arranged in a row direction, each of the plurality of data signal lines is connected to a sub-pixel column consisting of the plurality of sub-pixels arranged in the column direction, and the sub-pixel column consisting of the plurality of sub-pixels of a first color and the plurality of sub-pixels of a second color is adjacent to the sub-pixel column consisting of the plurality of sub-pixels of the second color and the plurality of sub-pixels of a third color.

Sixteenth Aspect

In the display device according to, for instance, the fifteenth aspect, each of the plurality of sub-pixels of the third color displaying a maximum gradation is applied with a data signal whose voltage is equal to a voltage of a data signal applied across each of the plurality of sub-pixels of the first color displaying the maximum gradation.

Seventeenth Aspect

In the display device according to, for instance, the sixteenth aspect, the drive transistor of each of the plurality of sub-pixels of the third color has a greater ratio of a channel width to a channel length than the drive transistor of each of the plurality of sub-pixels of the first color.

Eighteenth Aspect

In the display device according to, for instance, the fifteenth aspect, each of the sub-pixel rows includes a plurality of dots of a plurality of colors arranged in the row direction. Each of the plurality of dots consists of the plurality of sub-pixels of the same color sequentially arranged in the row direction. Further, two of the plurality of sub-pixels adjacent to each other in the column direction emit different colors of light.

Nineteenth Aspect

In the display device according to, for instance, the eighteenth aspect, each of the sub-pixel rows includes the plurality of dots periodically arranged in the row direction for each cycle consisting of three colors of the plurality of dots sequentially arranged, and two of the sub-pixel rows adjacent to each other have phases shifted from each other by a half of the cycle. The phases each indicate the order of dot color.

Twentieth Aspect

In the display device according to, for instance, the nineteenth aspect, the distance between the centers of gravity of the plurality of dots of the same color closest to each other is identical with regard to the first, second, and third colors.

Twenty-First Aspect

In the display device according to, for instance, the eighteenth aspect, one of two of the sub-pixel rows adjacent to each other in the column direction includes the plurality of dots periodically arranged for each cycle consisting of the dot of the first color and the dot of the second color sequentially arranged, another one of the two of the sub-pixel rows includes the plurality of dots periodically arranged for each cycle consisting of the dot of the second color and the dot of the third color adjacent to each other, and each of the plurality of dots of the second color is adjacent to the dot of the first color or the dot of the third color in the column direction.

Twenty-Second Aspect

In the display device according to, for instance, the twenty-first aspect, the distance between the centers of gravity of the plurality of dots of the same color closest to each other is identical with regard to the first and third colors.

Twenty-Third Aspect

In the display device according to, for instance, the fifteenth aspect, the light-emitting element is a light-emitting diode, the first color is red, the second color is green, and the third color is blue.

Twenty-Fourth Aspect

In the display device according to, for instance, the eighteenth aspect, the light-emitting element belonging to one of the two of the plurality of sub-pixels constituting each of the plurality of dots has an anode connected to an anode of the light-emitting element belonging to another one of the two of the plurality of sub-pixels.

Twenty-Fifth Aspect

In the display device according to, for instance, the eighteenth aspect, the light-emitting element belonging to one of the two of the plurality of sub-pixels constituting each of the plurality of dots has an anode connected, via a connecting transistor, to an anode of the light-emitting element belonging to another one of the two of the plurality of sub-pixels.

The invention claimed is:

1. A display device comprising:
a plurality of data signal lines;
a plurality of scan signal lines; and
a plurality of sub-pixels,
each of the plurality of sub-pixels including
a light-emitting element,
a write transistor connected to one of the plurality of data signal lines, and
a drive transistor configured to control a current that flows through the light-emitting element,
wherein the plurality of data signal lines include
a first data signal line,
a second data signal line adjacent to the first data signal line,
a third data signal line adjacent to the second data signal line, and
a fourth data signal line adjacent to the third data signal line,
the plurality of sub-pixels arranged along the first data signal line include adjacent sub-pixels that emit different colors of light, and each include the write transistor having a conduction terminal electrically connected to the first data signal line,
the plurality of sub-pixels arranged along the second data signal line include adjacent sub-pixels that emit different colors of light, and each include the write transistor having a conduction terminal electrically connected to the second data signal line,
the plurality of sub-pixels arranged along the third data signal line include adjacent sub-pixels that emit different colors of light, and each include the write transistor having a conduction terminal electrically connected to the third data signal line,
the plurality of sub-pixels arranged along the fourth data signal line include adjacent sub-pixels that emit different colors of light, and each include the write transistor having a conduction terminal electrically connected to the fourth data signal line,
the first data signal line is electrically connected to the conduction terminal of the write transistor of the sub-pixel that emits a first color of light and the conduction terminal of the write transistor of the sub-pixel that emits a second color of light,
the second data signal line is electrically connected to the conduction terminal of the write transistor of the sub-pixel that emits the first color of light and the conduction terminal of the write transistor of the sub-pixel that emits a third color of light,
the third data signal line is electrically connected to the conduction terminal of the write transistor of the sub-pixel that emits the second color of light and the conduction terminal of the write transistor of the sub-pixel that emits the third color of light,
the fourth data signal line is electrically connected to the conduction terminal of the write transistor of the sub-pixel that emits the first color of light and the conduction terminal of the write transistor of the sub-pixel that emits the second color of light,
the sub-pixel connected to the first data signal line and emitting the first color of light is adjacent to the sub-pixel connected to the second data signal line and emitting the first color of light,
the sub-pixel connected to the third data signal line and emitting the second color of light is adjacent to the sub-pixel connected to the fourth data signal line and emitting the second color of light,
the sub-pixel connected to the second data signal line and emitting the third color of light is adjacent to the sub-pixel connected to the third data signal line and emitting the third color of light, and
the light-emitting element included in the sub-pixel connected to the first data signal line and emitting the first color of light has a first electrode electrically connected to a first electrode of the light-emitting element included in the sub-pixel connected to the second data signal line and emitting the first color of light.

2. The display device according to claim 1, wherein the light-emitting element included in the sub-pixel connected to the first data signal line and emitting the first color of light has a first electrode electrically connected, via a transistor, to a first electrode of the light-emitting element included in the sub-pixel connected to the second data signal line and emitting the first color of light.

3. A display device comprising:
a plurality of data signal lines extending in a column direction;
a plurality of scan signal lines extending in a row direction; and
a plurality of sub-pixels arranged in matrix,
each of the plurality of sub-pixels including
   a light-emitting element,
   a write transistor connected to one of the plurality of data signal lines, and
   a drive transistor configured to control a current that flows through the light-emitting element,
each of the plurality of sub-pixels being connected to one of the plurality of scan signal lines,
wherein the plurality of sub-pixels that emit different colors of light are connected to each of the plurality of scan signal lines,
the plurality of sub-pixels that emit different colors of light are connected to each of the plurality of data signal lines,
the plurality of sub-pixels connected to each of the plurality of data signal lines emit two colors of light,
each of the plurality of scan signal lines is connected to a sub-pixel row comprising the plurality of sub-pixels arranged in the row direction,
each of the plurality of data signal lines is connected to a sub-pixel column comprising the plurality of sub-pixels arranged in the column direction,
the sub-pixel column comprising the plurality of sub-pixels of a first color and the plurality of sub-pixels of a second color is adjacent to the sub-pixel column comprising the plurality of sub-pixels of the second color and the plurality of sub-pixels of a third color,
each of the sub-pixel rows includes a plurality of dots of a plurality of colors arranged in the row direction, each of the plurality of dots comprising the plurality of sub-pixels of the same color sequentially arranged in the row direction,
two of the plurality of sub-pixels adjacent to each other in the column direction emit different colors of light,
each of the sub-pixel rows includes the plurality of dots periodically arranged in the row direction for each cycle comprising three colors of the plurality of dots sequentially arranged, and
two of the sub-pixel rows adjacent to each other have phases shifted from each other by a half of the cycle, the phases each indicating an order of dot color.

4. The display device according to claim 3, wherein the plurality of sub-pixels connected to each of the plurality of data signal lines emit three colors of light.

5. The display device according to claim 3, wherein each of the plurality of sub-pixels of the third color displaying a maximum gradation is applied with a data signal having a voltage equal to a voltage of a data signal applied across each of the plurality of sub-pixels of the first color displaying the maximum gradation.

6. The display device according to claim 5, wherein the drive transistor of each of the plurality of sub-pixels of the third color has a greater ratio of a channel width to a channel length than the drive transistor of each of the plurality of sub-pixels of the first color.

7. The display device according to claim 3, wherein a distance between centers of gravity of the plurality of dots of the same color closest to each other is identical with regard to the first, second, and third colors.

8. The display device according to claim 3, wherein
one of two of the sub-pixel rows adjacent to each other in the column direction includes the plurality of dots periodically arranged for each cycle comprising the dot of the first color and the dot of the second color sequentially arranged,
another one of the two of the sub-pixel rows includes the plurality of dots periodically arranged for each cycle comprising the dot of the second color and the dot of the third color adjacent to each other, and
each of the plurality of dots of the second color is adjacent to the dot of the first color or the dot of the third color in the column direction.

9. The display device according to claim 8, wherein a distance between centers of gravity of the plurality of dots of the same color closest to each other is identical with regard to the first and third colors.

10. The display device according to claim 3, wherein
the light-emitting element is a light-emitting diode,
the first color is red,
the second color is green, and
the third color is blue.

11. The display device according to claimer 3, wherein
the light-emitting element belonging to one of the two of the plurality of sub-pixels including in each of the plurality of dots has an anode connected to an anode of the light-emitting element belonging to another one of the two of the plurality of sub-pixels.

12. The display device according to claimer 3, wherein
the light-emitting element belonging to one of the two of the plurality of sub-pixels including in each of the plurality of dots has an anode connected, via a connecting transistor, to an anode of the light-emitting element belonging to another one of the two of the plurality of sub-pixels.

13. A display device comprising:
a plurality of data signal lines extending in a column direction;
a plurality of scan signal lines extending in a row direction; and
a plurality of sub-pixels arranged in matrix,
each of the plurality of sub-pixels including
   a light-emitting element,
   a write transistor connected to one of the plurality of data signal lines, and
   a drive transistor configured to control a current that flows through the light-emitting element,
each of the plurality of sub-pixels being connected to one of the plurality of scan signal lines,
wherein the plurality of sub-pixels that emit different colors of light are connected to each of the plurality of scan signal lines,
the plurality of sub-pixels that emit different colors of light are connected to each of the plurality of data signal lines,
the plurality of sub-pixels connected to each of the plurality of data signal lines emit two colors of light, each of the plurality of scan signal lines is connected to a sub-pixel row comprising the plurality of sub-pixels arranged in the row direction, each of the plurality of data signal lines is connected to a sub-pixel column comprising the plurality of sub-pixels arranged in the column direction, the sub-pixel column comprising the plurality of sub-pixels of a first color and the plurality of sub-pixels of a second color is adjacent to the sub-pixel column comprising the plurality of sub-pixels of the second color and the plurality of sub-pixels of a third color, each of the sub-pixel rows includes a plurality of dots of a plurality of colors arranged in the row direction, each of the plurality of dots comprising the plurality of sub-pixels of the same color sequentially arranged in the row direction, two of the plurality of sub-pixels adjacent to each other in the column direction emit different colors of light, one of two of the sub-pixel rows adjacent to each other in the column direction includes the plurality of dots periodically arranged for each cycle comprising the dot of the first color and the dot of the second color sequentially arranged, another one of the two of the sub-pixel rows includes the plurality of dots periodically arranged for each cycle comprising the dot of the second color and the dot of the third color adjacent to each other, and each of the plurality of dots of the second color is adjacent to the dot of the first color or the dot of the third color in the column direction.

14. The display device according to claim 13, wherein the plurality of sub-pixels connected to each of the plurality of data signal lines emit three colors of light.

15. The display device according to claim 13, wherein each of the plurality of sub-pixels of the third color displaying a maximum gradation is applied with a data signal having a voltage equal to a voltage of a data signal applied across each of the plurality of sub-pixels of the first color displaying the maximum gradation.

16. The display device according to claim 15, wherein the drive transistor of each of the plurality of sub-pixels of the third color has a greater ratio of a channel width to a channel length than the drive transistor of each of the plurality of sub-pixels of the first color.

17. The display device according to claim 13, wherein a distance between centers of gravity of the plurality of dots of the same color closest to each other is identical with regard to the first and third colors.

18. The display device according to claim 13, wherein
the light-emitting element is a light-emitting diode,
the first color is red,
the second color is green, and
the third color is blue.

19. The display device according to claim 13, wherein
the light-emitting element belonging to one of the two of the plurality of sub-pixels including in each of the plurality of dots has an anode connected to an anode of the light-emitting element belonging to another one of the two of the plurality of sub-pixels.

20. The display device according to claim 13, wherein
the light-emitting element belonging to one of the two of the plurality of sub-pixels including in each of the plurality of dots has an anode connected, via a connecting transistor, to an anode of the light-emitting element belonging to another one of the two of the plurality of sub-pixels.

* * * * *